United States Patent [19]

Lee et al.

[11] 4,323,983
[45] Apr. 6, 1982

[54] MAGNETIC BUBBLE DETECTOR

[75] Inventors: David M. Lee, Santa Clara; Donald K. Rose, Palo Alto; Richmond B. Clover, Sunnyvale, all of Calif.

[73] Assignee: Intel Magnetics, Inc., Santa Clara, Calif.

[21] Appl. No.: 65,361

[22] Filed: Aug. 9, 1979

[51] Int. Cl.³ .............................................. G11C 19/08
[52] U.S. Cl. ......................................................... 365/8
[58] Field of Search ...................................... 365/8, 43

[56] References Cited

U.S. PATENT DOCUMENTS

| 4,078,230 | 3/1978 | George ................................... 365/8 |
| 4,151,601 | 4/1979 | Verhulst ................................. 365/8 |

FOREIGN PATENT DOCUMENTS

| 602994 | 4/1979 | U.S.S.R. ................................. 365/8 |

OTHER PUBLICATIONS

IBM Technical Disclosure Bulletin-vol. 18, No. 11, Apr. 1976. pp. 3546-3547.

*Primary Examiner*—James W. Moffitt
*Attorney, Agent, or Firm*—Blakely, Sokoloff, Taylor & Zafman

[57] ABSTRACT

A magnetoresistive bubble detector which includes an expander, a first and second detector element and a dummy element is disclosed. An expanded bubble is propagated from the first detector element to the second detector element. The detectors are coupled in pairs with the first element of one detector and the second element of the other detector connected in a bridge circuit with the dummy elements. Two independent streams of spaced-apart bubbles are detected within the bridge circuit.

6 Claims, 3 Drawing Figures

U.S. Patent
Apr. 6, 1982
4,323,983
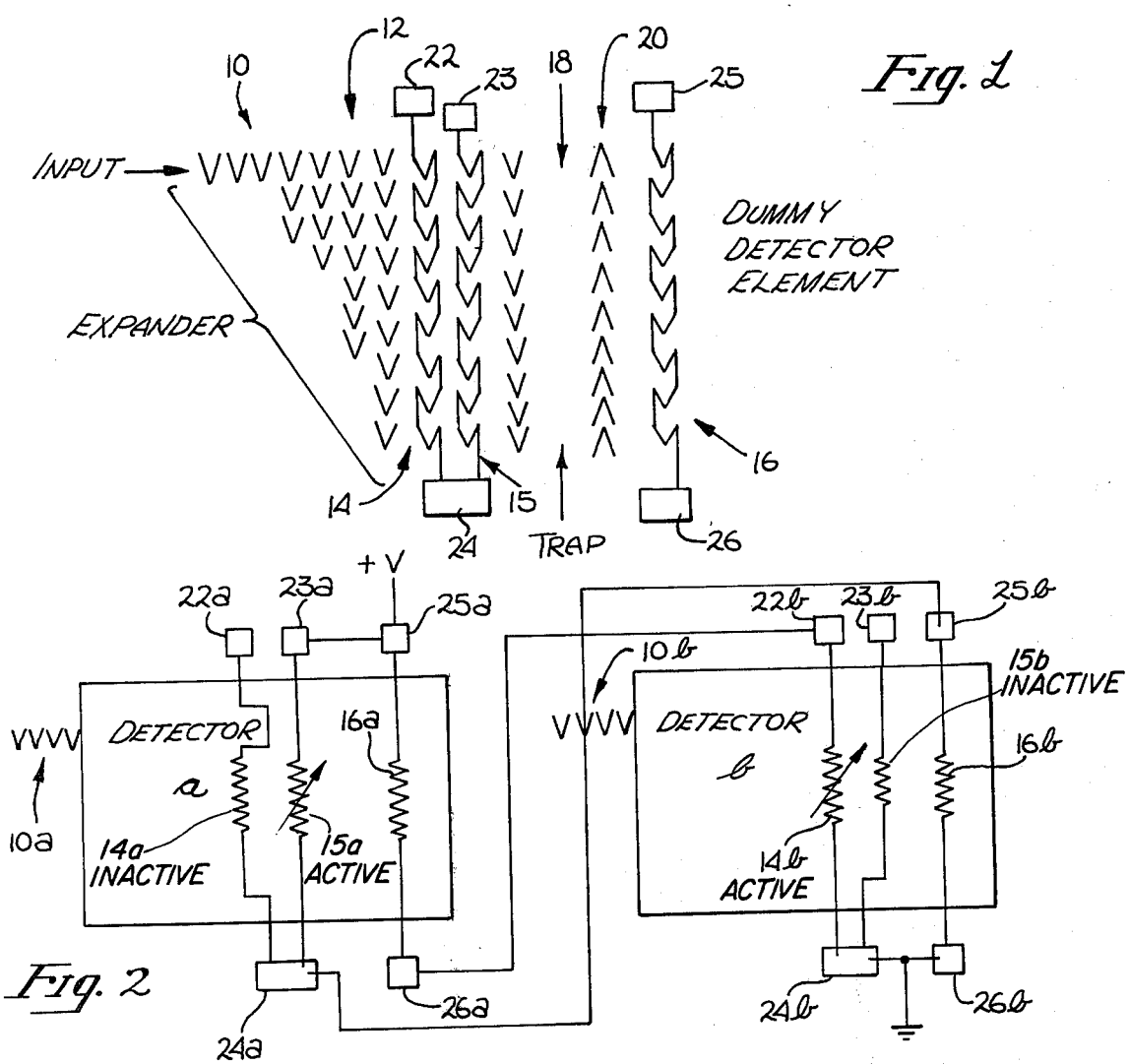
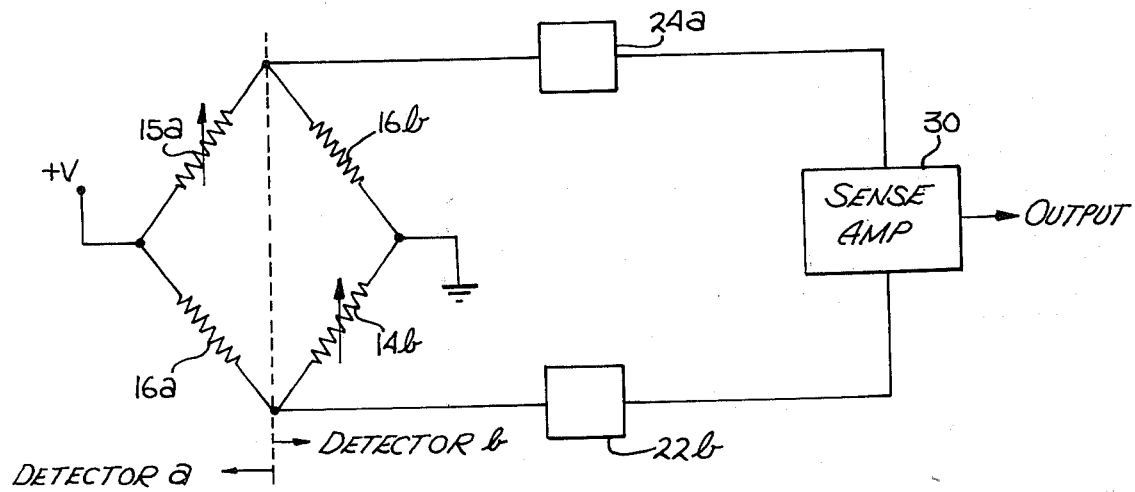

MAGNETIC BUBBLE DETECTOR

BACKGROUND OF THE INVENTION

1. Field of the Invention

The invention relates to the field of magnetoresistive detectors for detecting single wall domains.

2. Prior Art

Numerous detectors are well-known for detecting single wall magnetic domains (bubbles) which are moved in a layer of magnetic material by an in-plane rotating magnetic field. Most commonly these detectors rely upon the magnetoresistive properties of the permalloy materials used in magnetic bubble devices. The magnetic bubble is first expanded and then magnetically coupled to a magnetoresistive element and the resistance change of this element sensed. An expanded bubble or a plurality of bubbles provides a sufficient resistance change in the element to permit reliable sensing. Examples of detectors which employ an expanded bubble and a plurality of bubbles are described in U.S. Pat. Nos. 3,781,832 and 3,858,189.

One of the more commonly used detectors includes a plurality of columns of transfer elements such as chevron elements to first expand the bubble before detection. After expansion the bubble is propagated to interlinked chevron elements fabricated from a permalloy material having a magnetoresistive property. This type of detector, including an improvement in the shape of the chevron elements, is described in U.S. Pat. No. 4,019,177.

In magnetic bubble memories, it is common to merge two independent streams of bubbles into a single stream or train of bubbles before detection. In each stream the bubbles are spaced-apart and out of phase with the bubbles in the other stream so that the merging occurs without interfering with the data stored in each stream. The singlestream of data is coupled to a detector which includes an expander and the interlinked chevrons which form the detector stage. These detectors most frequently include an additional column of interlinked chevrons used as a "dummy" detector. The dummy detector is electrically coupled to the detector stage to provide noise cancellation, for example, to remove the effects of the in-plane rotating field. Two terminals of the detector stage and dummy stage are coupled to an off-chip sensor which includes a pair of external resistors forming a bridge circuit with the detector stage and dummy stage.

One advantage to the above-described detection apparatus is that only two terminals (package pins) are required for sensing the data in the two independent (merged) data streams. However, this detection means has the disadvantage of having the bubbles relatively close together (after merging) as they pass through the detector. This proximity of the bubbles to one another results in less reliable detection in the detector.

As will be seen, the present invention provides a magnetoresistive detection apparatus wherein the data in two independent streams of bubbles are sensed at two terminals and thus only two pins on the memory package are required. However, unlike the prior art detection scheme, the bubbles are not merged before detection and thus the problem associated with the close bubbles is eliminated.

SUMMARY OF THE INVENTION

A magnetoresistive detector for use in a magnetic apparatus which includes a layer of material in which single wall domains are moved in response to a changing magnetic field is described. The detectors are used in pairs, with each detector receiving a separate stream of spaced-apart bubbles. In one detector, the first detector element is active and the second detector element is inactive. In the other detector, the first detector element is inactive, and the second detector element is active. The active element of each detector is connected to the same bridge circuit. The bubbles in one stream of bubbles are detected by the active element in one detector, and the bubbles in the other stream are detected by the active element in the other detector. The active elements in the detectors are effectively spaced-apart from one another in time because the first element of one detector and the second element of the other detector are used. The bubbles in both streams can be sensed at the bridge circuit. Thus, instead of merging the bubbles before detection as done in the prior art, the electrical signals resulting from the two streams of bubbles are merged in the bridge circuit.

BRIEF DESCRIPTION OF THE DRAWINGS

FIG. 1 is a plan view showing a single detector used in the present invention.

FIG. 2 is a block diagram illustrating the interconnections between two detectors of FIG. 1.

FIG. 3 is an electrical schematic showing the equivalent circuit for the detectors of FIG. 2 and their coupling to a sense amplifier.

DETAILED DESCRIPTION OF THE INVENTION

An improved magnetoresistive detection apparatus for use in a magnetic apparatus which includes a layer of material in which single wall domains (bubbles) are moved under the influence of a rotating magnetic field is disclosed. The described detection apparatus, in its presently preferred embodiment as described below, is embodied in a one-megabit magnetic-bubble memory sold by Intel Magnetics, Inc., Santa Clara, California. This memory is generally described in "Megabit Bubble-Memory Chip Gets Support from LSI Family", *Electronics*, Apr. 26, 1979, beginning on page 105. Other aspects of the memory are described in co-pending application Ser. No. 25,848 filed Apr. 2, 1979 now U.S. Pat. No. 4,272,817, and Ser. No. 27,669 filed Apr. 6, 1979 now U.S. Pat. No. 4,229,248, both assigned to the assignee of the present application.

In general, in the presently preferred embodiment, the memory is fabricated on a garnet substrate, specifically a gadolinum gallium garnet ($Gd_3Ga_5O_{12}$). An ion implanted magnetic garnet (epitaxial layer) is employed on the substrate for the magnetic storage layer. The bubbles are moved in this layer in a well-known manner by an in-plane rotating magnetic field. Aluminum alloy conductors are fabricated on a silicon dioxide layer which is formed over the storage layer. Permalloy patterns which are formed from a material having a magnetoresistive property are fabricated on a second silicon dioxide layer which covers the conductors. A permanent magnetic field for biasing the magnetic layer and the in-plane, rotating magnetic field are employed, as is well-known.

Referring now to FIG. 1, a single detector is illustrated which is fabricated from the permalloy layer. The detector includes an input 10 comprising propagation elements, specifically chevrons. The bubbles propagated into the detector are first expanded by the expander 12. The expander 12, as is well-known, includes a plurality of columns of the chevron members. The columns have a general tapered outline with the bubbles moving from the shorter columns to the longer columns so that they are expanded. As will be appreciated, the expander 12, in the presently preferred embodiment, includes many more columns of the chevron members than are actually illustrated in FIG. 1.

The detector of FIG. 1 includes two detection elements 14 and 15. Each of these elements comprises interlinked chevron members. One end of these detection elements is connected to a pad 24. The other end of element 14 is connected to pad 22, and the other end of element 15 is coupled to pad 23. As is apparent, bubbles entering the expander at input 10 are expanded and then propagated to element 14 and then on to element 15.

A trap 18 is disposed to receive the expanded bubbles from the element 15. The trap is defined on one side by a column of chevron elements 20 having an opposite orientation to the other chevron elements of the detector. The column of elements 20 urges the bubbles in an opposite direction and thus contains them within the trap. The guards disposed about the edges of the trap and, in fact, the entire detector are not illustrated.

As is often the practice, the detector includes a "dummy" detector element 16. The element 16 comprises a column of interlinked chevron elements; the dummy detector element has the same general shape and size as the elements 14 and 15. The element 16 when coupled to one of the elements 14 or 15 provides noise rejection and establishes a resistance reference for a bridge circuit. The ends of the dummy element 16 terminate in the pads 25 and 26.

Referring now to FIG. 2, in the presently preferred embodiment, the detector of FIG. 1 is used in pairs with each detector receiving an independent stream or train of spaced-apart bubbles. In FIG. 2, the detector of FIG. 1 is shown duplicated as detector a and detector b. The pads 22, 23, 24, 25 and 26 of FIG. 1 are shown with like numbers in FIG. 2 but also with the lower case letters "a" and "b" to indicate the pad's relationship to either detector a or detector b. The inputs to each of the detectors are shown in FIG. 2 as 10a and 10b.

In each of the detectors only one of the two detector elements, such as elements 14 or 15 of FIG. 1, is used. (These detector elements shall be referred to as active detector elements to distinguish them from the inactive detector elements). When the detectors are paired, such as shown in FIG. 2, one element, such as element 14, is used in one detector for detection and the other element, such as element 15, is used in the second detector. Thus, referring to FIG. 2, detector a uses the active element 15a whereas detector b uses the active element 14b. (The other (inactive) detector element in each detector while not used for detection nonetheless propagates bubbles in the detector.)

The active detector elements of each of the detectors are connected in a bridge circuit along with their respective dumy detector elements. The equivalent circuit for the arrangement of FIG. 2 is shown in FIG. 3. This requires interconnecting leads between the bonding pads 23a and 25a, 24a and 25b, 26a and 22b, and 24b and 26b. A positive potential is applied to pads 23a/25a and ground potential to pads 24b/26b. All these mentioned interconnections are made by leads which are bonded between the pads. Note that even though leads and pads are used, it is not necessary to use pins on the package housing the memory. The pads 24a and 22b, however, are coupled to pins since signals from these pads are coupled to an external sense amplifier 30. The sense amplifier 30 may be an ordinary sense amplifier used to sense the change of resistance in the active magnetoresistive elements.

The output signals from the sense amplifier 30 are of the same polarity for each independent stream of bubbles with the data in these independent channels multiplexed at the output of this amplifier. Note that the output of the bridge circuit provides signals varying above and below the quiescent point of the bridge for each channel. However, since these signals are applied to different inputs of the sense amplifier 30, the output of this amplifier provides a train of indentical pulses.

The bridge circuit arrangement used for the active detectors yields a maximum output signal with excellent noise cancellation. It should be noted in this regard that all the resistance values of the four "resistors" are equal.

In the memory, the bubbles are stored in loops. Assuming that a loop contains all binary ones, a magnetic bubble is stored at every chevron element in the loop. Bubbles from these loops are replicated on independent paths leading to the detectors. Thus two independent streams of this stored data are coupled to the detectors of FIG. 1, more specifically, to the inputs 10a and 10b. The bubbles in each of these two independent streams when transferred to the paths leading to the detectors are spaced-apart from one another.

For sake of discussion, assume that the data in these streams are all binary ones and that the bubbles are located at every other chevron element leading to the detectors and every other column in the expanders. On a first revolution of the in-plane rotating magnetic field, a bubble is shifted into the active detector element 14b of detector b and to the first (inactive) detector element of detector a. The bubble is detected by detector b (at sense amp 30); however, since the first detector element in detector a is "floating" (i.e. not connected to a sense circuit), no detection occurs. On a second revolution of the in-plane rotating field, the first mentioned bubble in detector b is propagated to the second (inactive) detector element of detector b and, since this element is floating, no detection occurs. On the other hand, at element 14a the bubble from the first (inactive) detector element is moved to the second (active) detector element 15a where it is detected. Thus, the two independent streams of bubbles are detected by the detectors a and b.

Obviously, since each detector includes two detection elements 14 and 15, only one of which elements need be active in each detector, either element may be chosen to be active, as long as the element of the other detector of the pair utilized in the invention is selected appropriately. For example, if the first of the two elements of the first detector of the pair, element 14a, is chosen to be active, then the second of the two elements, namely element 15b, of the second pair of detectors, must be active. Thus, elements 15a and 14b would be made inactive. The reverse arrangement could also be used. Elements 15a and 14b, being the second element of the first detector and the first element of the second detector, could be made active instead, in which case elements 15b and 14a would be made inactive.

Significantly for the above-described detection apparatus, the detectors a and b may be identical. Thus the same masking artwork may be used for both detectors or for all four detectors used, in pairs, in the above-mentioned one megabit memory. Importantly, only two pins represented by the contacts 24a and 24b are required to externally sense the data from the two independent streams. Unlike the prior art sensing, the bubbles in the streams are not merged and thus are not in adjacent columns as they pass through the detector. As mentioned, this close proximity of bubbles in the detector has decreased reliability in prior art detectors.

Thus a magnetoresistive bubble detector has been disclosed which provides numerous advantages over prior art devices.

We claim:

1. An apparatus for detecting magnetic bubbles which are propagated in a layer of magnetic material under the influence of a rotating magnetic field comprising:
   a first and second magnetoresistive detector, each comprising:
   an expander means for expanding the size of magnetic bubbles;
   a first active magnetoresistive element adjacent to said expander means;
   a second inactive magnetoresistive element adjacent to said first element; and
   a dummy element for balancing out the effects of said rotating magnetic field;
   sensing circuit for sensing the change of resistance in magnetoresistive elements, said sensing circuit coupled to said first element of said first detector and said second element of said second detector;
   whereby two independent streams of spaced-apart bubbles coupled to said first and second detectors are sensed.

2. The apparatus defined by claim 1 wherein each of said detectors includes a third element for providing a reference resistance for said sensing circuit, said first, second and third elements of said detectors having substantially the same shape.

3. The apparatus defined by claim 2 wherein said first element of said first detector and said second element of said second detector, and said third elements are coupled in a bridge circuit.

4. The apparatus defined by claim 3 wherein said elements comprise interlinked chevrons.

5. An apparatus for detecting magnetic bubbles in two independent trains of bubbles which are propagated in a layer of magnetic material under the influence of a rotating magnetic field comprising:
   a first and a second detector, each comprising:
   a bubble expander section;
   a first interlinked column of active magnetoresistive chevron members disposed to receive expanded bubbles from said expander section;
   a second interlinked column of inactive magnetoresistive chevron members disposed to receive expanded bubbles from said first interlinked column;
   a trap disposed to receive and contain bubbles from said second interlinked column;
   a dummy element for balancing out the effects of said rotating magnetic field; and
   a sensing circuit coupled to said first interlinked column of said first detector and said second interlinked column of said second detector;
   whereby bubbles in said two independent trains of bubbles are sensed by said sensing circuit when the first train of bubbles is coupled to said first detector and the second train of bubbles is coupled to said second detector.

6. The apparatus defined by claim 5 each of said detectors includes a third interlinked column of magnetoresistive chevron members which are coupled in a bridge circuit with said first column of said first detector and said second column of said second detector.

* * * * *